(12) United States Patent
Ushida

(10) Patent No.: US 12,326,488 B2
(45) Date of Patent: Jun. 10, 2025

(54) MAGNETIC DETECTION DEVICE, MAGNETIC DETECTION UNIT, MAGNETIC DETECTION SYSTEM, AND METHOD FOR MANUFACTURING MAGNETIC DETECTION UNIT

(71) Applicant: Asahi Kasei Microdevices Corporation, Tokyo (JP)

(72) Inventor: Saki Ushida, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 197 days.

(21) Appl. No.: 18/341,765

(22) Filed: Jun. 27, 2023

(65) Prior Publication Data

US 2024/0053416 A1    Feb. 15, 2024

(51) Int. Cl.
*G01R 33/09*    (2006.01)
*G01D 5/245*    (2006.01)

(52) U.S. Cl.
CPC ........... *G01R 33/091* (2013.01); *G01D 5/245* (2013.01)

(58) Field of Classification Search
CPC ...... G01R 33/091; G01D 5/245; G01D 5/147; G01P 3/488
See application file for complete search history.

(56) References Cited

U.S. PATENT DOCUMENTS

| | | | |
|---|---|---|---|
| 6,356,074 B1 | 3/2002 | Ohkawa | |
| 2008/0049405 A1 | 2/2008 | Sahara | |
| 2012/0280677 A1* | 11/2012 | Furukawa | G01D 5/147 324/207.11 |
| 2013/0119980 A1* | 5/2013 | Ogomi | G01R 33/096 324/252 |
| 2015/0137796 A1* | 5/2015 | Ausserlechner | G01D 5/142 324/207.13 |
| 2018/0128882 A1* | 5/2018 | Yoshiya | G01R 33/0035 |
| 2018/0172421 A1* | 6/2018 | Hoell, Jr. | G01R 33/0094 |

FOREIGN PATENT DOCUMENTS

| | | |
|---|---|---|
| JP | S6215840 A | 1/1987 |
| JP | S6266115 A | 3/1987 |
| JP | H0238981 A | 2/1990 |
| JP | H0566133 A | 3/1993 |
| JP | H0682204 A | 3/1994 |
| JP | H08116176 A | 5/1996 |
| JP | H08204254 A | 8/1996 |
| JP | 2004271423 A | 9/2004 |
| JP | 2005203462 A | 7/2005 |

(Continued)

*Primary Examiner* — Alvaro E Fortich

(57) ABSTRACT

There is provided a magnetic detection device including: a substrate including: a hole portion into which a magnet is inserted from a side of one main surface; and a stopper for stopping, from a side of another main surface, the magnet inserted into the hole portion to prevent the magnet from protruding toward the side of the another main surface; and a magnetic sensor mounted at a position corresponding to the hole portion, in the another main surface. The substrate may include a first substrate, and a second substrate bonded to the first substrate from the side of the another main surface. The hole portion may be a first through hole formed in the first substrate. The stopper may include a region, in the second substrate, that closes the first through hole.

25 Claims, 12 Drawing Sheets

(56) References Cited

FOREIGN PATENT DOCUMENTS

| | | | |
|---|---|---|---|
| JP | 2005337865 | A | 12/2005 |
| JP | 2006189396 | A | 7/2006 |
| JP | 4240306 | B2 | 3/2009 |
| JP | 2009175073 | A | 8/2009 |
| JP | 2011163958 | A | 8/2011 |
| JP | 2015059262 | A | 3/2015 |

\* cited by examiner

MAGNETIC DETECTION DEVICE, MAGNETIC DETECTION UNIT, MAGNETIC DETECTION SYSTEM, AND METHOD FOR MANUFACTURING MAGNETIC DETECTION UNIT

The contents of the following patent application(s) are incorporated herein by reference:
No. 2022-129199 filed in JP on Aug. 15, 2022
No. 2023-065378 filed in JP on Apr. 13, 2023

TECHNICAL FIELD

The present invention relates to a magnetic detection device, a magnetic detection unit, a magnetic detection system, and a method for manufacturing a magnetic detection unit.

RELATED ART

Patent Document 1 recites "while a magnetic detector 3 formed of a package 8 assembled and integrated, a magnet 10, and a holder 11 is positioned and arranged in a case 2, the magnetic detector 3 is sealed with resin 4" (paragraph 0014).

PRIOR ART DOCUMENT

Patent Document

Patent Document 1: Japanese Patent Application Publication No. 2005-337865

DESCRIPTION OF EXEMPLARY EMBODIMENTS

Hereinafter, embodiments of the present invention will be described, but the embodiments do not limit the invention according to the claims. In addition, not all of the combinations of features described in the embodiments are essential to the solution of the invention.

Figure 1:
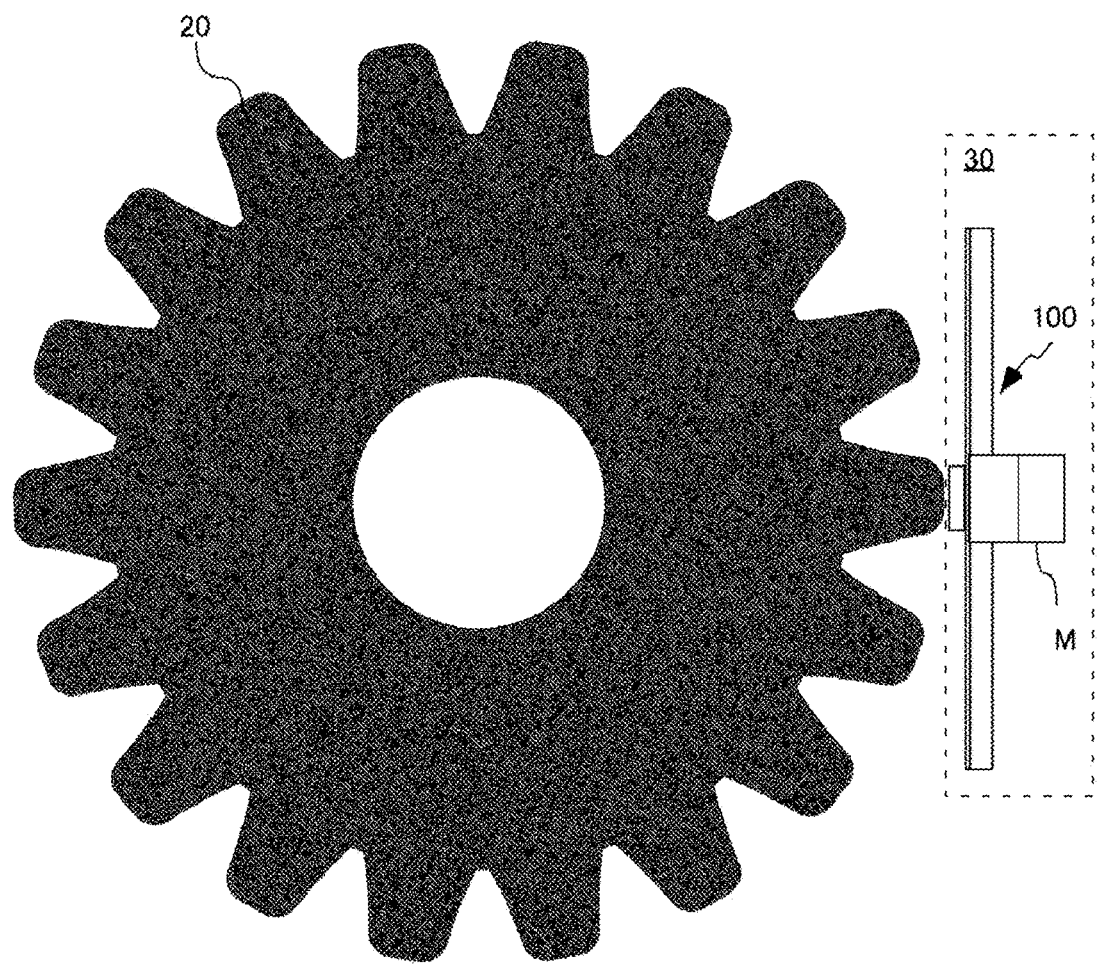
FIG. 1 shows a schematic side view diagram of a magnetic detection system 10 according to a first embodiment.

FIG. 1 shows a schematic diagram of a magnetic detection system 10 according to a first embodiment. In FIG. 1, a leftward direction, an upward direction, and a frontward direction are defined as a Z-axis positive direction, a Y-axis positive direction, and an X-axis positive direction, respectively. Note that a magnetic detection unit 30 is shown in a dashed frame in FIG. 1.

The magnetic detection system 10 includes a rotor 20 and the magnetic detection unit 30. The magnetic detection system 10 according to the present embodiment detects rotational motion of the rotor 20, such as at least one of a rotation angle, a rotation speed, a rotation direction, or a number of rotations by the magnetic detection unit 30.

The rotor 20 is a magnetic material, includes protrusions and/or recesses, and rotates about a rotation axis along the X-axis direction. For example, the rotor 20 has, in a cross-sectional shape substantially orthogonal to the rotation axis, vertices of the protrusions positioned on a circumference having a center at the rotation axis.

The rotor 20 may include recesses and protrusions aligned alternately along a direction of relative movement on a side toward the magnetic detection unit 30. The rotor 20 may be, for example, a gear or a gear-shaped component. FIG. 1 shows an example in which the rotor 20 includes a shape of a disk, on a circumference of which the recesses and protrusions are aligned alternately along a rotational movement direction. Note that the rotor 20 is an example of a unit to be detected.

The magnetic detection unit 30 is provided facing the rotor 20 on a Z-axis negative side of the rotor 20 to detect changes in a magnetic flux density associated with the relative movement of the rotor 20. The magnetic detection unit 30 includes a magnetic detection device 100 provided on a side facing the rotor 20, and a magnet M provided on a side opposite to the side facing the rotor 20. In other words, the magnetic detection unit 30 has, from a Z-axis negative side, the magnet M and the magnetic detection device 100 arranged in this order. Note that, simply for illustrative purposes, FIG. 1 shows part of the magnetic detection device 100 transparent so that an entire side of the magnet M is visible, and so does the subsequent figures.

The magnet M generates a predetermined substantially constant magnetic field. By way of an example, the magnet M may be a permanent magnet containing samarium-cobalt, and the permanent magnet may have a residual magnetic flux density of approximately 800 mT.

The magnet M is arranged such that a magnetic pole face of a N pole or S pole faces the rotor 20. The magnet M is arranged in such close proximity to the rotor 20 that the generated magnetic field reaches the protrusions and/or recesses included by the rotor 20.

The magnetic detection device 100 is arranged between the rotor 20 and the magnet M, closer to the rotor 20 than to the magnet M, and faces the protrusions and/or recesses included by the rotor 20. The magnetic detection device 100 detects changes in the magnetic flux density of a magnetic force generated by the magnet M in association with the protrusions and/or recesses of the rotor 20. The magnetic detection device 100 detects the rotational motion of the rotor 20 based on the magnetic flux density that changes depending on the rotation of the rotor 20.

Figure 2:
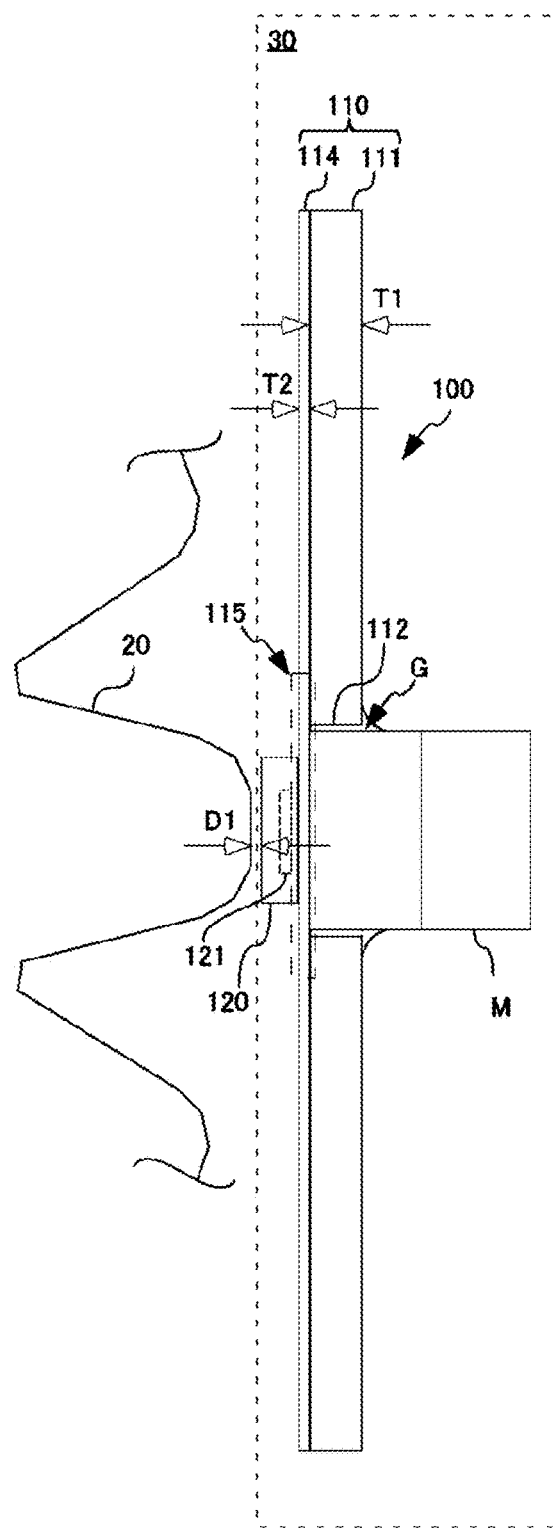
FIG. 2 shows a partially enlarged view of the magnetic detection system 10 shown in FIG. 1.
Figure 3:
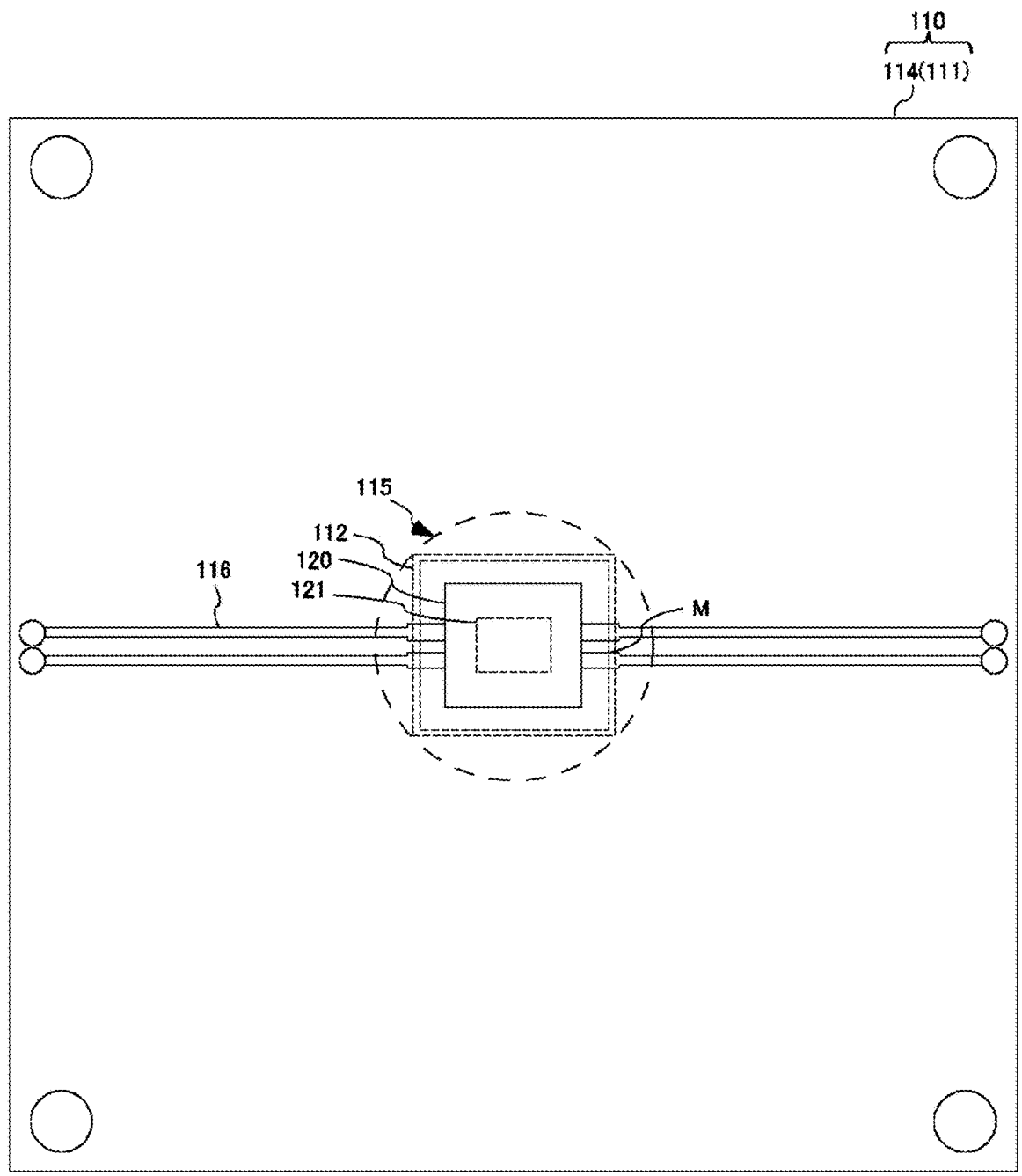
FIG. 3 shows a schematic plan view of a magnetic detection device 100 according to the first embodiment.

FIG. 2 shows a partially enlarged view of the magnetic detection system 10 shown in FIG. 1, and FIG. 3 shows a schematic plan view of the magnetic detection device 100 according to the first embodiment. Note that the magnetic detection unit 30 is shown in a dashed frame in FIG. 2 as well as in FIG. 1.

The magnetic detection device 100 includes a substrate 110, and a magnetic sensor 120 provided on a side facing the rotor 20. In the present embodiment, the substrate 110 is a non-magnetic plate member. As shown in FIG. 2, the substrate 110 includes a first substrate 111, and a second substrate 114 bonded to the first substrate 111 from a side facing the rotor 20. The first substrate 111 and the second substrate 114 according to the present embodiment may be joined to each other with an adhesive, for example, an adhesive sheet such as a thin adhesive film. The first substrate 111 and the second substrate 114 may be joined to each other with a liquid adhesive in place of or in addition to the adhesive sheet. As shown in FIGS. 2 and 3, contours forming outer shapes of respective main surfaces of the first substrate 111 and the second substrate 114 may be substantially identical. Thereby, the first substrate 111 and the second substrate 114 may be joined to each other over the entire surfaces facing each other.

The first substrate 111 has a first through hole 112 formed therein. The magnet M is inserted into the first through hole 112. FIG. 3 shows the first through hole 112 and the magnet M, each indicated by dashed lines, each visually unrecognizable from a side of the second substrate 114.

As shown in FIG. 2, by way of an example, the magnet M has at least a part of a surface, excluding the magnetic pole face, fixed to a side surface of the first through hole 112 with an adhesive G. Note that because, during operation of the magnetic detection system 10, the magnetic rotor 20 is always positioned on a side of the magnetic sensor 120 as if the magnet M is attracted by the magnetic force of itself to the second substrate 114, the magnet M may not be fixed to the side surface of the first through hole 112 with the adhesive G. Note that the magnet M may be fixed to the side surface of the first through hole 112 by means other than the adhesive G. Note that the first through hole 112 is an example of a hole portion into which the magnet M is inserted from a side of one main surface of the substrate 110.

The second substrate 114 includes a stopper 115. The stopper 115 stops, from the side facing the rotor 20, of the first substrate 111, the magnet M inserted into the first through hole 112 of the first substrate 111. Thereby, the stopper 115 prevents the magnet M from protruding toward a side facing the rotor 20, of the second substrate 114.

The substrate 110 having a combination of the stopper 115 and the first through hole 112, an example of the hole portion described above, may be defined as having an ability to allow the magnet M to be positioned closer to the main surface of the substrate 110 on a side facing the rotor 20, i.e., a Z-axis positive side, than to the main surface of the substrate 110 on a side opposite to the side facing the rotor 20, i.e., a Z-axis negative side, as well as to prevent the magnet M from pushing the magnetic sensor 120 toward the rotor 20.

By way of an example, the stopper 115 according to the present embodiment includes a region, in the second substrate 114, that closes the first through hole 112 of the first substrate 111. In other words, the region, in the second substrate 114, that closes the first through hole 112 of the first substrate 111 acts as the stopper 115 that stops, from the side facing the rotor 20, of the first substrate 111, the magnet M inserted into the first through hole 112 of the first substrate 111. More specifically, no through hole is formed in a region, in the second substrate 114, corresponding to the first through hole 112 of the first substrate 111, and the stopper 115 of the second substrate 114 serves as a wall separating the magnet M and the magnetic sensor 120 and prevents the magnetic sensor 120 from being pushed toward the rotor 20 by the magnet M. FIGS. 2 and 3 show the region included in the stopper 115, in a dashed frame. So does the subsequent figures.

The magnetic sensor 120 is mounted at a position on the side facing the rotor 20, of the second substrate 114. The magnetic sensor 120 is soldered to an electrode (not shown) formed on the second substrate 114, and the electrode is electrically connected to conductor patterns 116 formed on the second substrate 114 shown in FIG. 3. Note that the magnetic sensor 120 is connected to a power supply (not shown) through the electrode and the conductor patterns 116, and is supplied with voltage from the power supply. Note that the magnetic sensor 120 may be connected to the power supply by other electrical conduction means, for example, such as a conductive wire or an electrical wire in place of or in addition to the conductor patterns 116. The magnetic sensor 120 includes a magneto-sensitive portion 121. The magneto-sensitive portion 121 senses magnitude and direction of the magnetic field generated by the magnet M. The magneto-sensitive portion 121 may include, for example, a magneto resistive element, a hall element, a coil, a reed switch, and the like. FIGS. 2 and 3 show the magneto-sensitive portion 121 in a dashed frame, which will not be shown in subsequent figures.

By way of an example, the magneto-sensitive portion 121 of the magnetic sensor 120 according to the present embodiment may be a magneto resistive element, such as a semiconductor magneto resistive element (SMR) for which indium antimonide (InSb) is used. The magneto-sensitive portion 121 of the magnetic sensor 120 may be another magneto resistive element, for example, such as an anisotropic magneto resistive element (AMR), a giant magneto resistive element (GMR), or a tunnel magneto resistive element (TMR), in place of or in addition to the SMR. In this case, the magneto-sensitive portion 121 includes a plurality of resistors made of InSb, aligned along the movement direction of the protrusions and/or recesses of the rotor 20. An interval between the plurality of resistors may be determined depending on a pitch of the protrusions and/or recesses of the rotor 20. Note that InSb described above has higher mobility than indium arsenide (InAs), aluminum indium antimonide (AlInSb), and the like, and is suitable as a material for SMR.

As can be understood from the above description, The magnetic detection unit 30 according to the present embodiment has, from the Z-axis negative side, the magnet M, the first substrate 111, the second substrate 114, and the magnetic sensor 120 arranged in this order. As shown in FIGS. 2 and 3, the magnetic sensor 120 may be arranged within an area encircled with a contour forming an outer shape of the magnet M when viewed from a side of one main surface of the substrate 110. In the present embodiment, the magnet M must be of a predetermined size or more in order to apply a magnetic force of a predetermined magnitude or more to the magnetic sensor 120, on the other hand, because there is no lower limit on a size of the magnetic sensor 120, the magnetic sensor 120 can be relatively downsized depending on design demands. Downsizing the magnetic sensor 120 can reduce manufacturing costs, and reducing a footprint of the magnetic sensor 120 on the substrate 110 can expand a mounting space for other components.

In this case, as shown in FIGS. 2 and 3, the magneto-sensitive portion 121 is included in an area of the magnet M when viewed from the side of one main surface of the substrate 110. Thus, the magnetic field of the magnet M can be equally applied over the entire magneto-sensitive portion 121. Note that at least a part of an outer peripheral region of the magnetic sensor 120, excluding the magneto-sensitive portion 121, may not be included in the area of the magnet M when viewed from the side of one main surface of the substrate 110.

Each thickness of the first substrate 111 and the second substrate 114 in the Z-axis direction may be substantially constant or may partially change at any location within an XY plane. FIG. 2 shows a primary thickness of the first substrate 111 as T1 and a primary thickness of the second substrate 114 as T2.

The second substrate 114 may be thinner than the first substrate 111. By way of an example, a thickness of the region, in the second substrate 114, that closes the first through hole 112 of the first substrate 111 may be 0.1 mm or more and 0.6 mm or less. It may be difficult to manufacture a second substrate 114 having a thickness of less than 0.1 mm in whole or in part. The thickness of the region of the second substrate 114 is set to 0.6 mm or less and, for example, a permanent magnet containing samarium-cobalt having a residual magnetic flux density of approximately 800 mT is used as the magnet M, so that the magnetic flux density applied to the magnetic sensor 120 by the magnet M can be 400 mT or more. Thus, an output signal amplitude (Vpp) of the magnetic sensor 120 can be equal to or greater than a predetermined magnitude, and thereby, a detection accuracy by the magnetic sensor 120 of a change in the magnetic flux density can be equal to or greater than a predetermined threshold value.

Note that a distance between the rotor 20 and the magnetic sensor 120 indicated by D1 in FIG. 2 may be, for example, approximately 0.2 mm. Note that the distance may be referred to as an air gap.

Note that, as shown in FIG. 3, holes through which a means for fixing the first substrate 111 and the second substrate 114 to other devices, frames, or the like is inserted may be formed through both of the substrates at four corners of each of the main surfaces of the first substrate 111 and the second substrate 114, each having a substantially square outer shape. Note that an outer shape of the substrate 110, for example, the outer shape of the first substrate 111 and the second substrate 114 is not limited to the substantially square described above, and may be any other shape, for example, such as circular or elliptical. Note that, as shown in FIG. 3, each of the plurality of conductor patterns 116 formed on the main surface on the side facing the rotor 20, of the second substrate 114, has one end connected to the magnetic sensor 120 and the other end connected to an electrode for the power supply of the substrate 110, and thereby, the magnetic sensor 120 and the power supply described above may be connected electrically.

Here, by way of a first comparative example with the magnetic detection unit 30 according to the present embodiment, a magnetic detection device is investigated in which a magnetic sensor is arranged so as to cover a through hole formed in a substrate, and a magnet is inserted into the through hole. The magnetic sensor of the magnetic detection device has a configuration in which a magneto resistive element is packaged in a resin package, and has a lead frame exposed in a central region of a back surface of the resin package. The lead frame of the magnetic sensor is soldered to an electrode on the substrate at several points in an outer edge side of the lead frame. The magnet is fixed with an adhesive to a region, in a main surface on a side facing the substrate, of the magnetic sensor, that closes the through hole of the substrate. That is, the central region of the lead frame exposed on the main surface on the side facing the substrate, of the magnetic sensor, is covered with the magnet. The substrate is fixed to another device, frame, or the like.

In such a first comparative example, use of the magnetic detection device with the magnetic sensor facing a unit to be detected that moves relative to the fixed substrate applies a force to the magnetic sensor to be pushed toward the unit to be detected due to a magnetic force of the magnet that is attracting the unit to be detected. Consequently, a part fixing the magnetic sensor to the substrate may break, and the magnetic sensor may be struck against the unit to be detected to be sandwiched between the magnet and the unit to be detected.

Also in such a first comparative example, because the central region of the lead frame exposed on the main surface on the side facing the substrate, of the magnetic sensor, is covered with the magnet, a heat dissipation of the magnetic sensor is lower than that when the central region is covered with a member having high thermal conductivity, such as an electrode.

By way of a second comparative example with the magnetic detection device 100 according to the present embodiment, a magnetic detection device is investigated in which a magnetic sensor is arranged on one main surface of a substrate not having a through hole formed, and a magnet is arranged at a corresponding position on another main surface of the substrate. The magnetic sensor of the magnetic detection device is soldered at several points to an electrode on the substrate. The magnet is fixed with an adhesive on the substrate. The substrate is fixed to another device, frame, or the like.

In such a second comparative example, a thickness of the substrate is set to approximately 1.4 mm in order to secure strength. That is, a distance between the magnetic sensor and the magnet is approximately 1.4 mm. In order to apply a magnetic flux density of 400 mT or more from the magnet to the magnetic sensor across such a distance, a neodymium magnet, which has a highest magnetic force among permanent magnets, or a samarium-cobalt magnet of large size should be used as the magnet.

However, because a neodymium magnet has poor temperature characteristics compared with a samarium-cobalt magnet, as a temperature of a heating element in a surrounding environment of a magnetic detection device, such as a machine tool motor to which a magnetic detection device is attached, increases, a magnetic field is decreased, and thus, the output signal amplitude (Vpp) is reduced. Consequently, for example, an angle error with respect to air gap variations between the magnetic detection device and a unit to be detected can be large due to a shape having protrusions and recesses of a surface to be detected of the unit to be detected, which causes correction for the error to be difficult, and thus accuracy in detecting a magnetic flux density change may decrease.

On the other hand, use of a samarium-cobalt magnet of large size requires the samarium-cobalt magnet to be made quite large in order to apply the magnetic flux density of 400 mT or more to the magnetic sensor across the distance of approximately 1.4 mm. It is difficult to mount a magnetic detection device including such a large samarium-cobalt magnet on an encoder that has a limited size.

In contrast, a magnetic detection device 100 according to the present embodiment includes a substrate 110 including a first through hole 112 into which a magnet M is inserted from a side of one main surface, and a stopper 115 for stopping, from a side of the another main surface, the magnet M inserted into the first through hole 112 to prevent the magnet M from protruding toward the side of another main surface. The magnetic detection device 100 according to the present embodiment includes, in another main surface of the substrate 110, a magnetic sensor 120 mounted at a position corresponding to the first through hole 112.

The magnetic detection device 100 with such a configuration can have a distance between the magnet M and the magnetic sensor 120 that is shorter than a primary thickness of the substrate 110, for example, of approximately 1.4 mm, or that is approximately 0.2 mm, for example. The distance between the magnet M and the magnetic sensor 120 is made shorter than a predetermined length, so that, even with a samarium-cobalt magnet that has a size applicable to an encoder as the magnet M, the magnetic flux density applied to the magnetic sensor 120 by the magnet M can be 400 mT or more. Thus, an output signal amplitude (Vpp) of the magnetic sensor 120 can be equal to or greater than a predetermined magnitude, and consequently, the angle error described above is suppressed and the detection accuracy by the magnetic sensor 120 of a change in the magnetic flux density can be equal to or greater than a predetermined threshold value.

On the other hand, the magnetic detection device 100 prevents the magnet M from protruding toward a side facing a unit to be detected, of the substrate 110, and thereby prevents the magnetic sensor 120 from being pushed toward the unit to be detected, thus avoiding a strike of the magnetic sensor 120 against the unit to be detected.

In addition, in the magnetic detection device 100 according to the present embodiment, the substrate 110 may include a first substrate 111, and a second substrate 114 bonded to the first substrate 111 from a side facing the rotor 20, in which a region, in the second substrate 114, that closes the first through hole 112 of the first substrate 111 may act as a stopper 115. In this case, an electrode is provided in the region on the side facing the rotor 20, of the second substrate 114, and a lead frame of the magnetic sensor 120 is soldered to the electrode. Also in this case, the magnetic sensor 120 may be arranged within an area encircled with a contour forming an outer shape of the magnet M when viewed from a side of one main surface of the substrate 110.

The magnetic detection device 100 with such a configuration can improve a heat dissipation of the magnetic sensor 120 compared with the first comparative example described above. Also, in the magnetic detection device 100 with such a configuration, because there is no lower limit on a size of the magnetic sensor 120, the magnetic sensor 120 can be downsized depending on design demands, downsizing the magnetic sensor 120 can reduce manufacturing costs, and can reduce a footprint of the magnetic sensor 120 on the substrate 110, thereby expanding a mounting space for other components.

In order to verify that the above-described effect can be obtained by the magnetic detection device 100 according to the present embodiment, the inventors and the like of the present application prepared the magnetic detection device 100 including the first substrate 111 and the second substrate 114 that are bonded to each other with the adhesive sheet and have substantially identical contours forming the outer shapes of the respective main surfaces, and using a push-pull gauge, conducted a test in which stress was applied to the magnet M inserted into the first through hole 112 of the first substrate 111. The inventors and the like of the present application also conducted a similar test on the magnetic detection device according to the first comparative example described above.

Results of the tests confirmed that the magnetic detection device according to the first comparative example caused a solder portion that fixed the magnetic sensor to the substrate to be separated and destroyed at approximately 10 N applied, and the magnetic detection device 100 according to the present embodiment did not cause the first substrate 111 and the second substrate 114 to be separated even at approximately 30 N applied.

Figure 4:
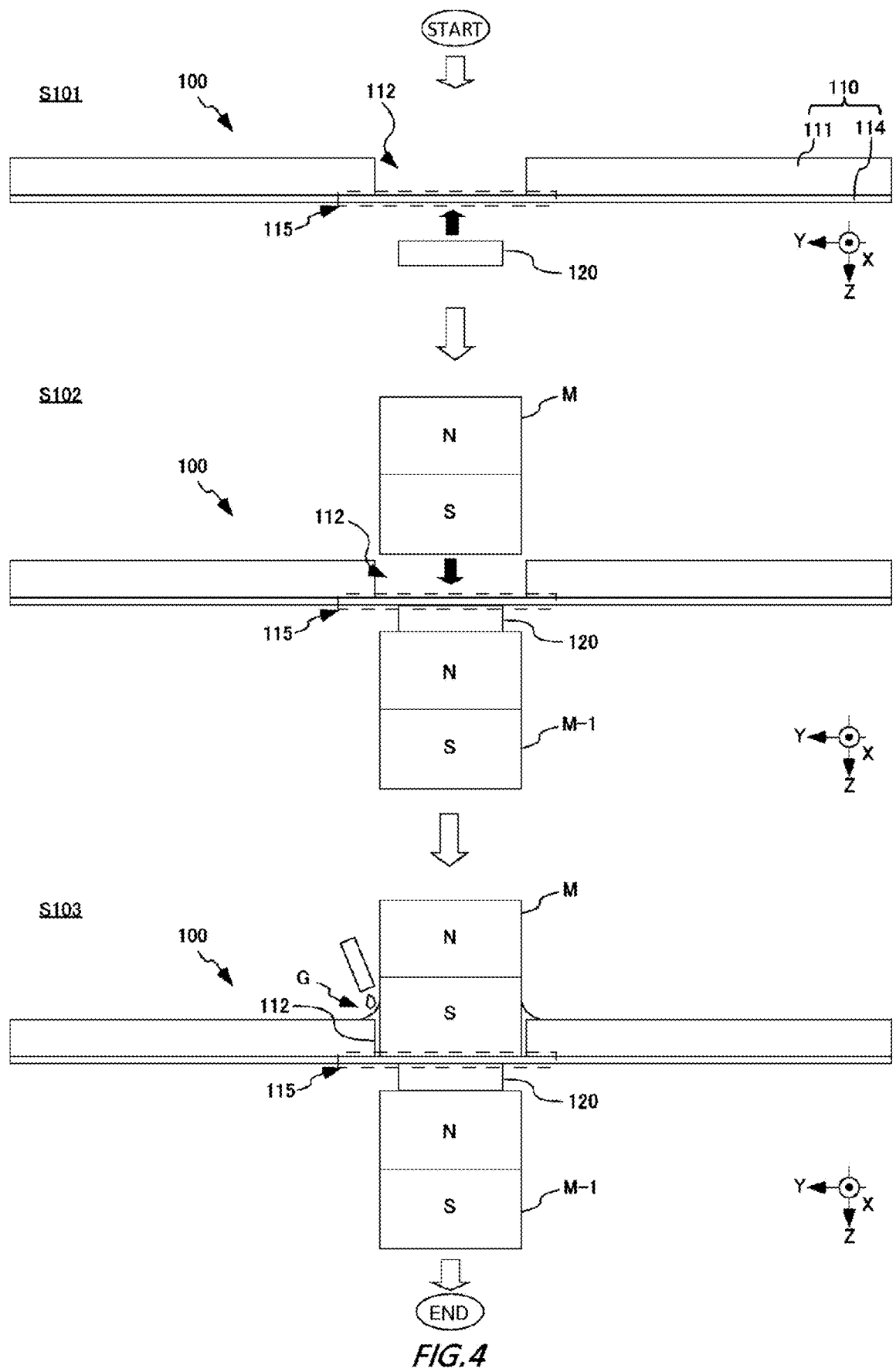
FIG. 4 shows a flow chart showing an example of a method for manufacturing a magnetic detection unit 30 according to the first embodiment.

FIG. 4 shows a flow chart showing an example of a method for manufacturing the magnetic detection unit 30 according to the first embodiment. A flow shown in FIG. 4 may start by preparing the substrate 110 consisting of the first substrate 111 and the second substrate 114 that are bonded to each other with the adhesive sheet and have substantially identical contours forming the outer shapes of the respective main surfaces.

The magnetic sensor 120 is mounted on the substrate 110 at a position corresponding to the first through hole 112 in the main surface of the substrate 110 on the Z-axis positive side (step S101). The magnet M is inserted into the first through hole 112 with a ferromagnetic material or other magnet M-1 brought closer to or into contact with the magnetic sensor 120 on the Z-axis positive side of the substrate 110, so that the magnetic pole face of the magnet M is made parallel to the magnetic sensor 120 (step S102). Note that, in step S102, a ferromagnetic material such as iron may be used in place of the other magnet M-1. In addition, instead of bringing the other magnet M-1 into contact with the magnetic sensor 120, the other magnet M-1 may be brought closer to the magnetic sensor 120.

Injecting the adhesive G between at least a part of the surface of the magnet M, excluding the magnetic pole face, and the side surface of the first through hole 112 and curing the adhesive fix the magnet M to the side surface of the first through hole 112 (Step S103), and thus, the magnetic detection unit 30 is completed, and the flow ends. Note that, in step S103, the other magnet M-1 may be removed, for example, after the adhesive G is cured and the magnet M is fixed to the side surface of the first through hole 112.

In the magnetic detection device 100 according to the above first embodiment, the substrate including the above-described hole portion and stopper is introduced by describing the substrate 110 including a combination of the first substrate 111, including the first through hole 112, and the thin second substrate 114 bonded to the side toward the rotor 20, of the first substrate 111. In addition, the first through hole 112 and the second substrate 114 are described as having substantially identical contours forming the outer shapes of the respective main surfaces. A structure of the substrate including the above-described hole portion and stopper is not limited to these. For example, the two substrates to be bonded may have different contours forming the outer shapes of the respective main surfaces from each other. The substrate including the hole portion and stopper described above may be a single substrate. As long as the magnet M can be inserted into the substrate from the Z-axis negative side, the above-described hole portion may be a through hole whose size changes continuously or stepwise or may be a depression or recess that does not penetrate the substrate.

Figure 5:
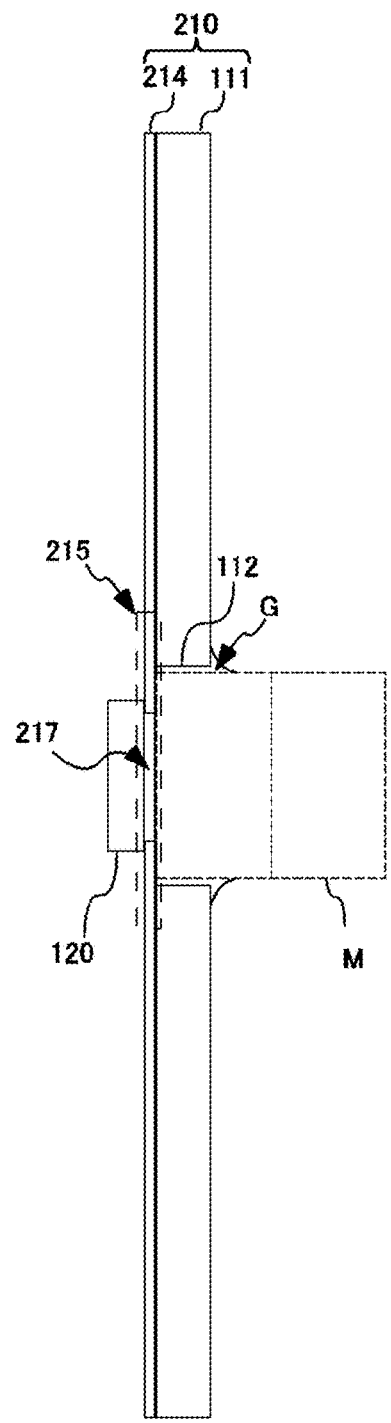
FIG. 5 shows a schematic side view of a magnetic detection device 200 according to a second embodiment.

FIG. 5 shows a schematic side view of a magnetic detection device 200 according to a second embodiment. The magnetic detection device 200 is different from the magnetic detection device 100 according to the first embodiment in that a substrate 210 including a second substrate 214 is provided in place of the substrate 110 including the second substrate 114. Other configurations of the magnetic detection device 200 may be similar to corresponding configurations of the magnetic detection device 100 according to the first embodiment, and reference numbers used in the corresponding configurations of the first embodiment are used to avoid duplicate descriptions. In addition, FIG. 5 shows a magnet M not included in the magnetic detection device 200, indicated by dashed lines. These are applied to descriptions of a subsequent plurality of embodiments.

The substrate 210 includes a first substrate 111, and the second substrate 214 bonded to the first substrate 111. A stopper 215 of the second substrate 214 includes a region, in the second substrate 114, that closes a first through hole 112 of the first substrate 111, and the region includes a second through hole 217 through which the magnet M cannot pass. The magnetic detection device 200 according to the second embodiment, which includes the substrate 210 having such a structure, also has similar effects to the magnetic detection device 100 of the first embodiment.

Figure 6:
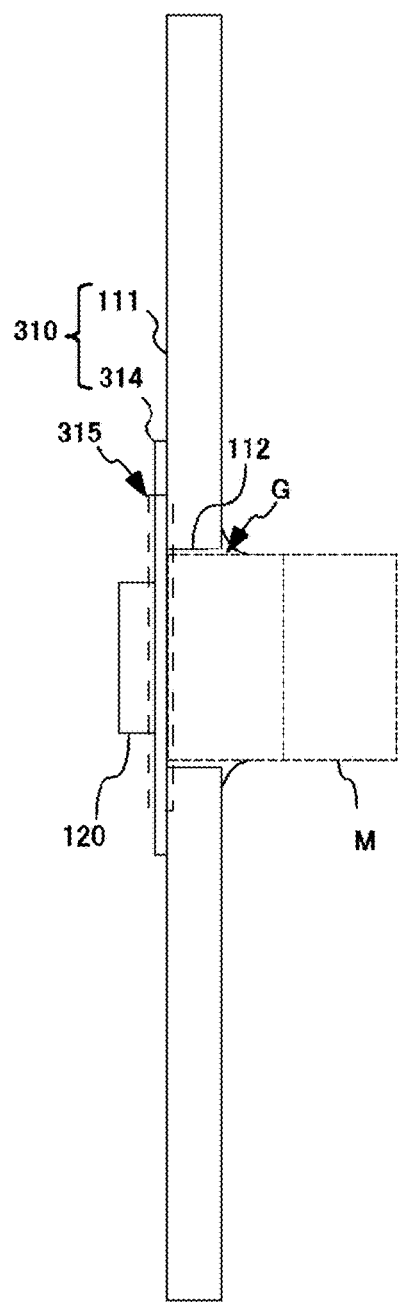
FIG. 6 shows a schematic side view of a magnetic detection device 300 according to a third embodiment.

FIG. 6 shows a schematic side view of a magnetic detection device 300 according to a third embodiment. The magnetic detection device 300 is different from the magnetic detection device 100 according to the first embodiment in that a substrate 310 including a second substrate 314 is provided in place of the substrate 110 including the second substrate 114.

The substrate 310 includes a first substrate 111, and the second substrate 314 bonded to the first substrate 111. At least a part of the second substrate 314 is formed of a ferromagnetic material, and a contour forming an outer shape of a main surface of the second substrate 314 is substantially identical to or smaller than the contour forming the outer shape of the main surface of the first substrate 111. By way of an example, the second substrate 314 is formed of a ferromagnetic material containing a material having high magnetic permeability, such as iron, and may have a surface insulated so as not to conduct with the magnetic sensor 120. As shown in FIG. 6, by way of an example, the contour of the second substrate 314 is smaller than the contour of the first substrate 111, as long as a stopper 315 of the second substrate 314 includes a region that closes a first through hole 112 of the first substrate 111, the second substrate 314 itself may have a modest size large enough to close the first through hole 112. The magnetic detection device 300 according to the third embodiment, which includes the substrate 310 having such a structure, also has similar effects to the magnetic detection device 100 of the first embodiment. Further, in the magnetic detection device 300 of the third embodiment, because an amount of change in a magnetic flux density of a magnetic force generated from a magnet M increases due to an effect of collecting magnetism of the second substrate 314 formed of a ferromagnetic material including a material having high magnetic permeability, an output signal amplitude (Vpp) of the magnetic sensor 120 can be further increased compared with the magnetic detection device 100 of the first embodiment.

Figure 7:
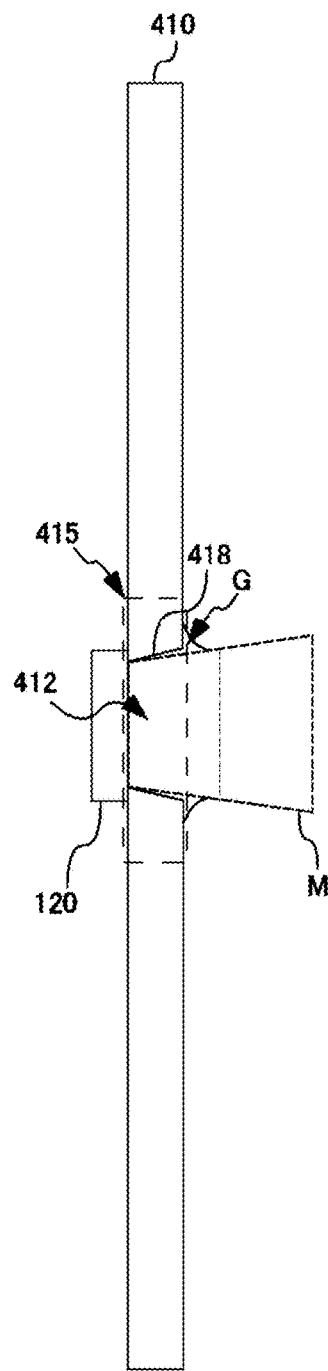
FIG. 7 shows a schematic side view of a magnetic detection device 400 according to a fourth embodiment.

FIG. 7 shows a schematic side view of a magnetic detection device 400 according to a fourth embodiment. The magnetic detection device 400 is different from the magnetic detection device 100 according to the first embodiment in that a single substrate 410 is provided in place of the substrate 110 including the second substrate 114.

The substrate 410 includes a through hole 412 into which a magnet M is inserted from a Z-axis negative side of the substrate 410, and a stopper 415 that stops, from a Z-axis positive side, the magnet M inserted into the through hole 412. The stopper 415 includes an inclined surface 418 that stops the magnet M from the Z-axis positive side. A combination of the through hole 412 and the stopper 415 including the inclined surface 418 may be defined as the through hole whose size changes continuously. The magnet M according to the present embodiment has a shape complementary to the inclined surface 418 of the stopper 415. In other words, the magnet M according to present embodiment has a tapered shape in its cross section in a YZ plane, at least in a part inserted into the substrate 410. The magnetic detection device 400 according to the fourth embodiment, which includes the substrate 410 having such a structure, also has similar effects to the magnetic detection device 100 of the first embodiment. Further, the magnetic detection device 400 of the fourth embodiment can increase a bonding area between the substrate 410 and the magnet M compared with the magnetic detection device 100 of the first embodiment. Note that the magnet M may not have the shape complementary to the inclined surface 418 of the stopper 415, and may have, for example, a rectangular parallelepiped shape, similar to the other embodiments. Even in this case, the stopper 415, of the substrate 410, including the inclined surface 418 can increase the bonding area between the substrate 410 and the magnet M compared with the magnetic detection device 100 of the first embodiment.

Figure 8:
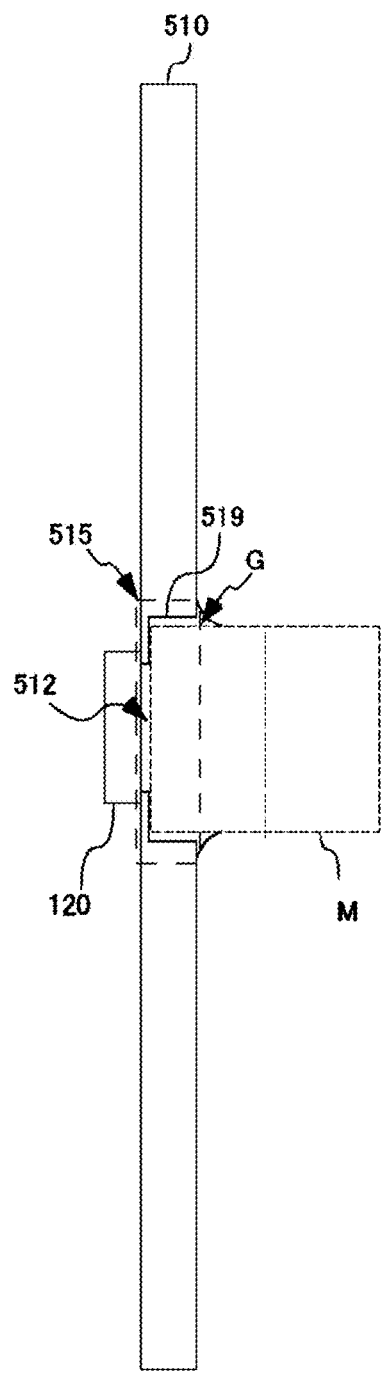
FIG. 8 shows a schematic side view of a magnetic detection device 500 according to a fifth embodiment.

FIG. 8 shows a schematic side view of a magnetic detection device 500 according to a fifth embodiment. The magnetic detection device 500 is different from the magnetic detection device 100 according to the first embodiment in that a single substrate 510 is provided in place of the substrate 110 including the second substrate 114.

The substrate 510 includes a through hole 512 into which a magnet M is inserted from a Z-axis negative side of the substrate 510, and a stopper 515 that stops, from a Z-axis positive side, the magnet M inserted into the through hole 512. The stopper 515 includes a step 519 that stops the magnet M from the Z-axis positive side. A combination of the through hole 512 and the stopper 515 including the step 519 may be defined as the through hole whose size changes stepwise. The magnetic detection device 500 according to the fifth embodiment, which includes the substrate 510 having such a structure, also has similar effects to the magnetic detection device 100 of the first embodiment.

Figure 9:
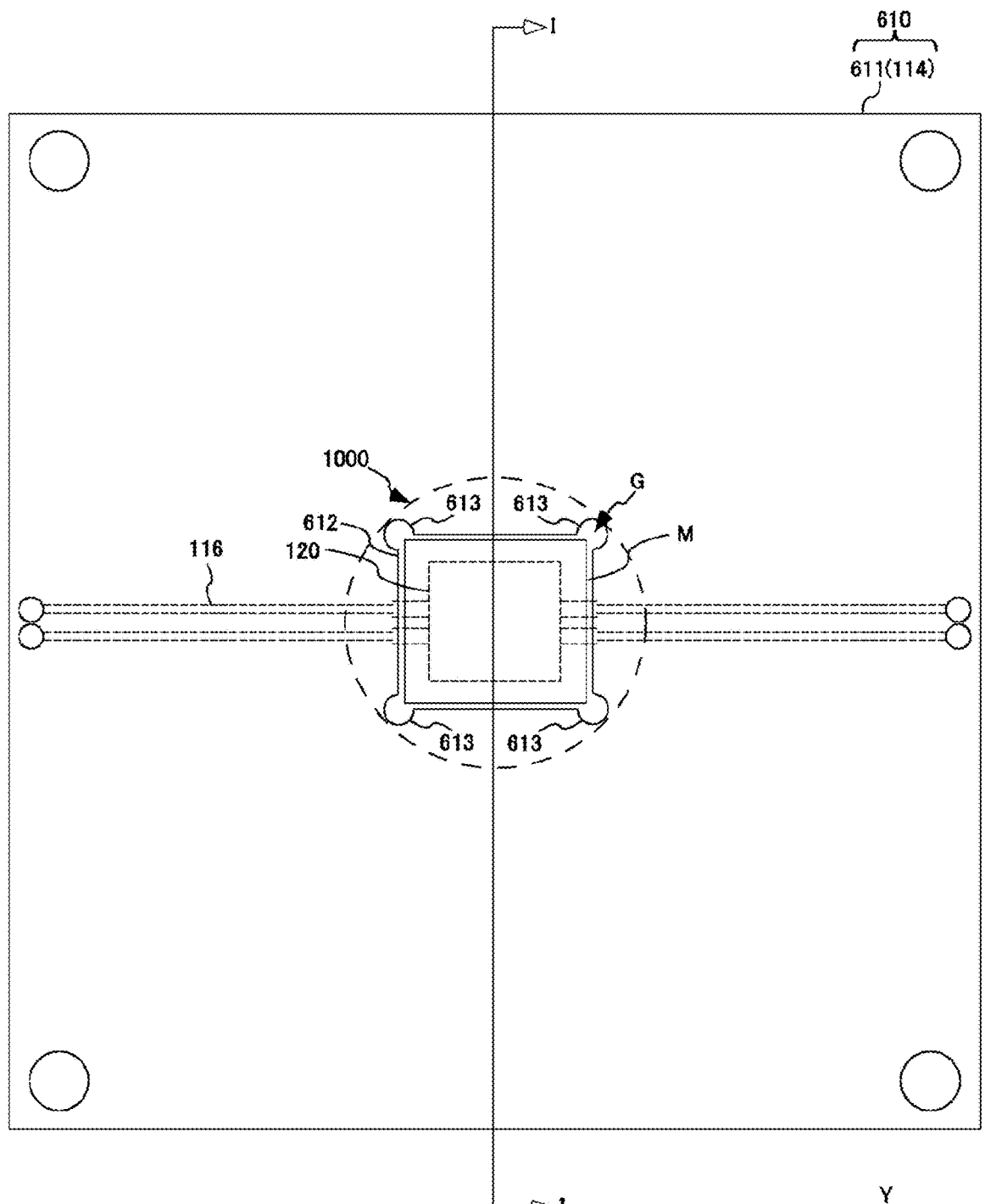
FIG. 9 shows a schematic plan view of a magnetic detection device 600 according to a sixth embodiment.

FIG. 9 shows a schematic plan view of a magnetic detection device 600 according to a sixth embodiment. The magnetic detection device 600 according to the sixth embodiment is different from the magnetic detection device 100 according to the first embodiment in that a substrate 610 including a first substrate 611 and a second substrate 114 is provided in place of the substrate 110. The first substrate 611 and the second substrate 114 according to the present embodiment are joined to each other with a liquid or film adhesive.

The first substrate 611 according to the present embodiment differs from the first substrate 111 of the first embodiment in that a first through hole 612 is formed in place of the first through hole 112. A magnet M is inserted into the first through hole 612. FIG. 9 shows a magnetic sensor 120 and a conductor pattern 116, each indicated by dashed lines, each visually unrecognizable from a side of the first substrate 611.

As shown in FIG. 9, the first through hole 612 may have, when viewed from a side of one main surface, a rectangular contour complementary to a rectangular contour forming an outer shape of the magnet M. When viewed from the side of one main surface, at least one of a plurality of corners 613 of a rectangular contour of the first through hole 612 may be recessed outward from a rectangular primary contour of the first through hole 612. In the example shown, the first through hole 612 has a substantially square contour when viewed from the side of one main surface, and four corners 613 of the contour are recessed outward from a substantially square primary contour of the first through hole 612. Note that an above-described term "rectangular" may refer to "substantially square," "substantially rectangular," or the like. Each corner portion 613 may be an example of a receiving portion formed around the first through hole 612. The receiving portion receives an adhesive protruding from between the first substrate 611 and the second substrate 114.

Figure 10:
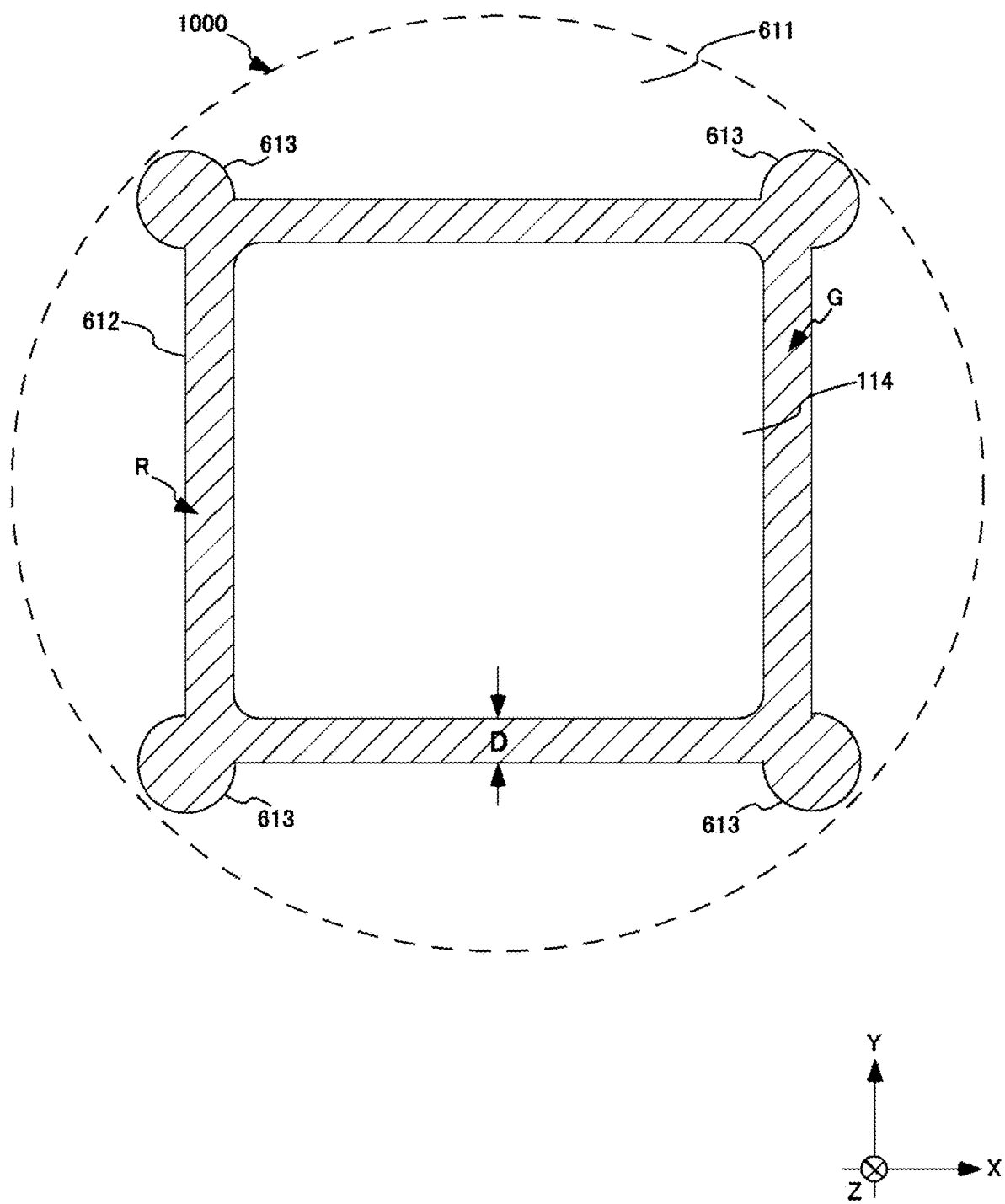
FIG. 10 shows an enlarged view of a region 1000 shown in FIG. 9.

FIG. 10 shows an enlarged view of a region 1000 shown in FIG. 9. A hatched region R in FIG. 10 indicates the adhesive protruding from between the first substrate 611 and the second substrate 114. Simply for clarity of explanation, FIG. 10 shows the second substrate 114 exposed inside the first through hole 612 of the first substrate 611 without showing the magnet M, the magnetic sensor 120, or the conductor pattern 116.

As shown in FIG. 10, when viewed from the side of one main surface, a range D in which the adhesive protrudes from between the first substrate 611 and the second substrate 114 toward an inside of the first through hole 612 may be contained within a predetermined range, for example, within 0.2 mm from the contour of the first through hole 612.

Figure 11:
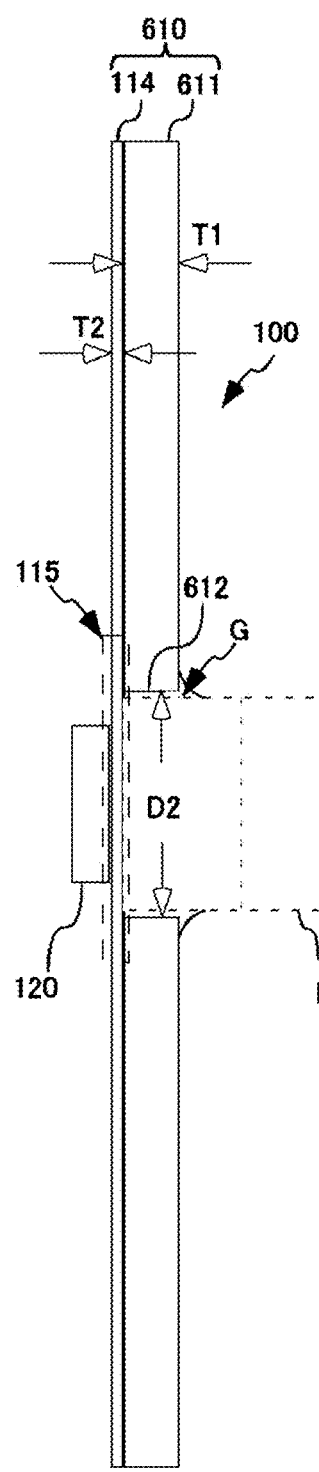
FIG. 11 shows a schematic YZ cross-sectional view of the magnetic detection device 600 virtually cut along line I-I in FIG. 9.

FIG. 11 shows a schematic YZ cross-sectional view of the magnetic detection device 600 virtually cut along line I-I in FIG. 9. FIG. 11, similar to FIG. 2, shows a primary thickness of the first substrate 611 as T1 and a primary thickness of the second substrate 114 as T2. FIG. 11 further shows a width of the first through hole 612 in the Y-axis direction as D2. In the present embodiment, by way of an example, T1 may be 1.4 mm, T2 may be 0.2 mm, and D2 may be 4.6 mm.

Figure 12:
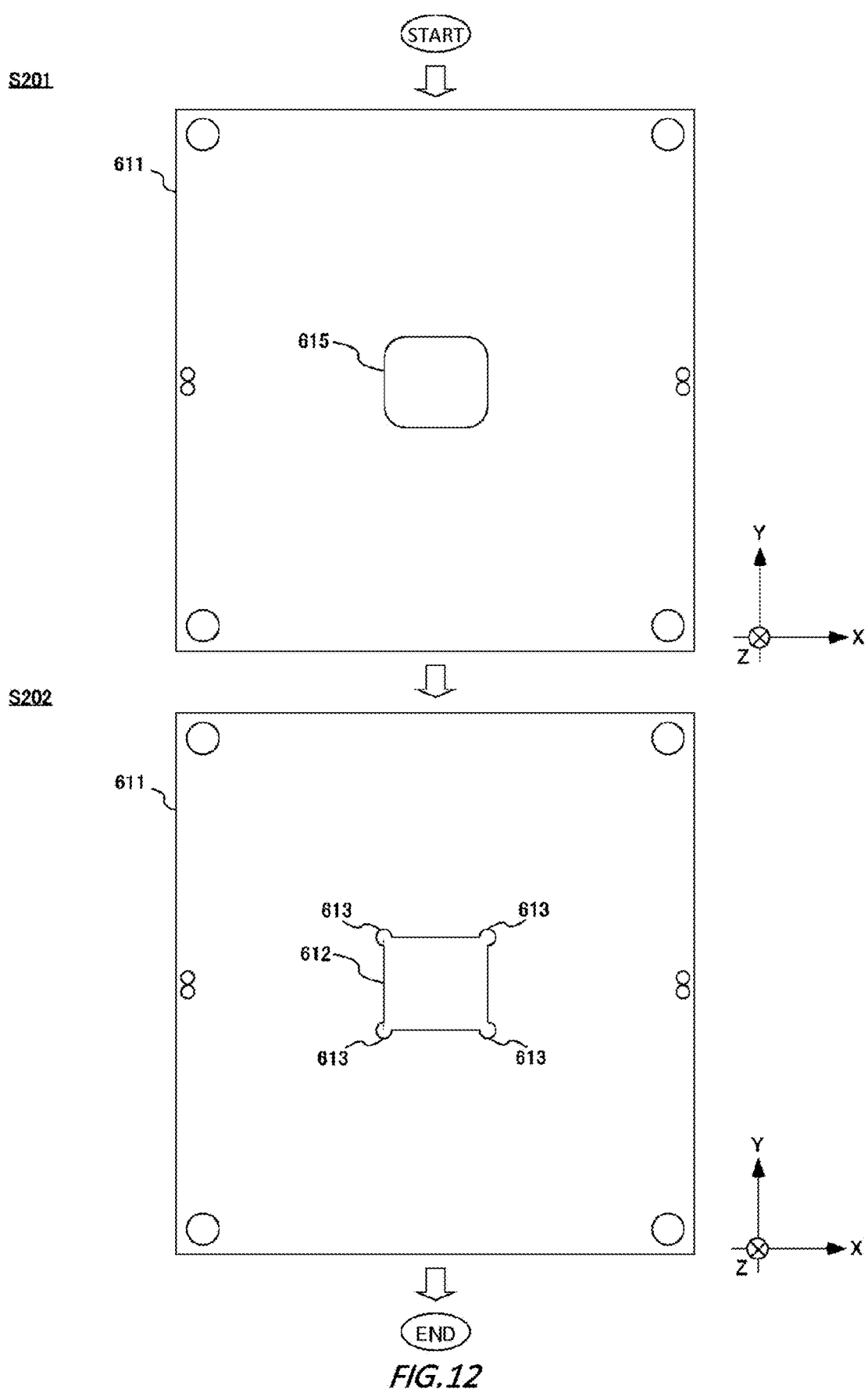
FIG. 12 shows a flow chart showing an example of a method for forming a first through hole 612 of a first substrate 611 in the magnetic detection device 600 according to the sixth embodiment.

FIG. 12 shows a flow chart showing an example of a method for forming the first through hole 612 of the first substrate 611 in the magnetic detection device 600 according to the sixth embodiment. The flow in FIG. 12 may be started by preparing the first substrate 611 in which the first through holes 612 are not formed.

Using a first cutting tool, such as a router, a through hole 615 is formed in a central region of a main surface on a Z-axis negative side of the first substrate 611, i.e., in a position corresponding to a position in which the magnetic sensor 120 is mounted on the second substrate 114 bonded to the first substrate 611 (step S201). The through hole 615 has, when viewed from a side of one main surface of the first substrate 611, a substantially square contour complementary to the substantially square contour forming the outer shape of the magnet M. However, due to router specifications, it may be difficult to machine respective corners of the through hole 615 at a right angle, in which the magnet M possibly cannot be inserted into the through hole 615 because of interference at corners of the magnet M. Therefore, a second cutting tool including a cutting blade smaller than that of the first cutting tool is used to round the four corners of the through hole 615 (step S202), and thereby, the first through hole 612 having the four corners 613 is completed and the flow ends. The first substrate 611 is provided with the first through holes 612 having the four corners 613, so that the interference of the magnet M can be prevented.

While the present invention has been described by way of the embodiments, the technical scope of the present invention is not limited to the above-described embodiments. It is apparent to persons skilled in the art that various alterations or improvements can be made to the above-described embodiments. It is also apparent from the description of the claims that the embodiments to which such alterations or improvements are made can be included in the technical scope of the present invention.

The operations, procedures, steps, and stages of each process performed by a device, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCE NUMBERS

10: Magnetic detection system, 20: Rotor, 30: Magnetic detection unit, 100, 200, 300, 400, 500: Magnetic detection device, 110, 210, 310, 410, 510, 610: Substrate, 111, 611: First substrate, 112, 612: First through hole, 114, 214, 314: Second substrate, 115, 215, 315, 415, 515: Stopper, 116: Conductor pattern, 120: Magnetic sensor, 121: Magneto-sensitive portion, 217: Second through hole, 412, 512: Through hole, 418: Inclined surface, 519: Step, G: Adhesive, M: Magnet, 613: Corner, and 615: Through hole.

What is claimed is:

1. A magnetic detection device comprising:
    a substrate comprising: a hole portion into which a magnet is inserted from a side of one main surface; and a stopper for stopping, from a side of another main surface, the magnet inserted into the hole portion to prevent the magnet from protruding toward the side of the another main surface; and
    a magnetic sensor mounted at a position corresponding to the hole portion, in the another main surface.

2. The magnetic detection device according to claim 1, wherein
    the substrate comprises: a first substrate; and a second substrate bonded to the first substrate from the side of the another main surface,
    the hole portion is a first through hole formed in the first substrate, and
    the stopper comprises a region, in the second substrate, that closes the first through hole.

3. The magnetic detection device according to claim 2, wherein
    the second substrate is thinner than the first substrate.

4. The magnetic detection device according to claim 3, wherein
    the region, in the second substrate, that closes the first through hole has a thickness of 0.1 mm or more and 0.6 mm or less.

5. The magnetic detection device according to claim 2, wherein
    the region, in the second substrate, that closes the first through hole comprises a second through hole through which the magnet cannot pass.

6. The magnetic detection device according to claim 2, wherein
    the first substrate and the second substrate are joined to each other with an adhesive.

7. The magnetic detection device according to claim 6, wherein
    the first substrate and the second substrate are joined to each other with an adhesive sheet.

8. The magnetic detection device according to claim 2, wherein contours forming outer shapes of respective main surfaces of the first substrate and the second substrate are substantially identical.

9. The magnetic detection device according to claim 2, wherein
at least a part of the second substrate is formed of a ferromagnetic material, and
a contour forming an outer shape of a main surface of the second substrate is substantially identical to or smaller than a contour forming an outer shape of a main surface of the first substrate.

10. The magnetic detection device according to claim 1, wherein
the stopper comprises an inclined surface that stops the magnet from the side of the another main surface.

11. The magnetic detection device according to claim 1, wherein
the stopper comprises a step that stops the magnet from the side of the another main surface.

12. The magnetic detection device according to claim 1, wherein
the magnetic sensor is a magneto resistive element.

13. The magnetic detection device according to claim 12, wherein
the magnetic sensor is a semiconductor magneto resistive element (SMR) for which indium antimonide (InSb) is used.

14. The magnetic detection device according to claim 1, wherein
the magnetic sensor is arranged within an area encircled with a contour forming an outer shape of the magnet when viewed from the side of the one main surface.

15. The magnetic detection device according to claim 1, wherein
a magnetic flux density applied to the magnetic sensor by the magnet is 400 mT or more.

16. A magnetic detection unit comprising:
the magnetic detection device according to claim 1; and
the magnet, wherein
the magnet has at least a part of a surface, excluding a magnetic pole face, fixed to a side surface of the hole portion with an adhesive.

17. A magnetic detection system comprising:
a unit to be detected; and
a magnetic detection unit provided facing the unit to be detected to detect changes in a magnetic flux density associated with a relative movement of the unit to be detected, wherein the magnetic detection unit comprises:
a magnet provided on a side opposite to a side facing the unit to be detected;
a substrate comprising: a hole portion into which the magnet is inserted from the side opposite; and a stopper for stopping, from the side facing, the magnet inserted into the hole portion to prevent the magnet from protruding toward the side facing; and
a magnetic sensor mounted at a position corresponding to the hole portion, on the side facing of the substrate.

18. The magnetic detection system according to claim 17, wherein
the magnet has at least a part of a surface, excluding a magnetic pole face, fixed to a side surface of the hole portion with an adhesive.

19. The magnetic detection system according to claim 17, wherein
a magnetic flux density applied to the magnetic sensor by the magnet is 400 mT or more.

20. The magnetic detection system according to claim 17, wherein
the unit to be detected comprises recesses and protrusions aligned alternately along a direction of the relative movement on a side toward the magnetic detection unit.

21. The magnetic detection system according to claim 20, wherein
the unit to be detected is a gear.

22. The magnetic detection system according to claim 17, wherein
the hole portion has, when viewed from the side opposite, a substantially rectangular contour complementary to a rectangular contour forming an outer shape of the magnet, and
when viewed from the side opposite, at least one of a plurality of corners of the substantially rectangular contour of the hole portion is recessed outward from the substantially rectangular contour of the hole portion.

23. The magnetic detection system according to claim 17, wherein
the substrate comprises: a first substrate; and a second substrate bonded to the first substrate from the side facing the unit to be detected,
the hole portion is a first through hole formed in the first substrate,
the stopper comprises a region, in the second substrate, that closes the first through hole,
the first substrate and the second substrate are joined to each other with an adhesive, and
a receiving portion is formed around the first through hole, the receiving portion receiving the adhesive protruding from between the first substrate and the second substrate.

24. The magnetic detection system according to claim 17, wherein
the substrate comprises: a first substrate; and a second substrate bonded to the first substrate from the side facing the unit to be detected,
the hole portion is a first through hole formed in the first substrate,
the stopper comprises a region, in the second substrate, that closes the first through hole,
the first substrate and the second substrate are joined to each other with an adhesive, and
when viewed from the side opposite, a range in which the adhesive protrudes from between the first substrate and the second substrate toward an inside of the first through hole is within 0.2 mm from a contour of the first through hole.

25. A method for manufacturing a magnetic detection unit, comprising:
mounting a magnetic sensor on a substrate comprising: a hole portion into which a magnet is inserted from a side of one main surface; and a stopper for stopping, from a side of another main surface, the magnet inserted into the hole portion to prevent the magnet from protruding toward the side of the another main surface, wherein the magnetic sensor is mounted at a position corresponding to the hole portion, in the another main surface of the substrate;
causing a magnetic pole face of the magnet to be parallel to the magnetic sensor by inserting the magnet into the hole portion with a ferromagnetic material or other magnet brought closer to or into contact with the magnetic sensor on the side of the another main surface of the substrate; and fixing the magnet to a side surface of the hole portion by injecting an adhesive between at least a part of a surface of the magnet, excluding the magnetic pole face, and the side surface of the hole portion and curing the adhesive.

* * * * *